US005240877A

United States Patent [19]
Yoshida et al.

[11] Patent Number: 5,240,877
[45] Date of Patent: Aug. 31, 1993

[54] PROCESS FOR MANUFACTURING AN OHMIC ELECTRODE FOR N-TYPE CUBIC BORON NITRIDE

[75] Inventors: Katsuhito Yoshida; Kazuwo Tsuji, both of Hyogo, Japan

[73] Assignee: Sumitomo Electric Industries, Ltd., Osaka, Japan

[21] Appl. No.: 974,121

[22] Filed: Nov. 10, 1992

Related U.S. Application Data

[62] Division of Ser. No. 689,887, May 28, 1991, Pat. No. 5,187,560.

[30] Foreign Application Priority Data

Nov. 28, 1989 [JP] Japan ................... 1-308431

[51] Int. Cl.$^5$ ................... H01L 21/441; H01L 21/324
[52] U.S. Cl. ................... 437/184; 437/192; 437/247; 257/76
[58] Field of Search ............... 437/184, 192, 247; 257/76

[56] References Cited

U.S. PATENT DOCUMENTS

| | | | |
|---|---|---|---|
| 3,850,688 | 11/1974 | Halt | 437/184 |
| 4,831,212 | 5/1989 | Ogata et al. | 174/524 |
| 5,006,914 | 4/1991 | Beetz | 357/16 |
| 5,057,454 | 10/1991 | Yoshida | 437/184 |

FOREIGN PATENT DOCUMENTS

| | | |
|---|---|---|
| 8100932 | 4/1981 | European Pat. Off. . |
| 0029381 | 3/1981 | Japan . |
| 58-112336 | 7/1983 | Japan . |
| 1-179471 | 7/1989 | Japan . |

OTHER PUBLICATIONS

Mishima et al., "Appl. Phys. Lett.", 53(11) pp. 962-964 (Sep. 12, 1988).

Primary Examiner—John S. Maples
Attorney, Agent, or Firm—Wenderoth, Lind & Ponack

[57] ABSTRACT

An ohmic electrode for n-type cubic boron nitride is disclosed. The electrode is made of two thin films; and the first is at least one alloy material selected from a group consisting of Au-Si alloy, Au-Ge alloy and Au-Si-Ge alloy, and the second is at least one metallic material selected from a group consisting of Ni, Cr, Mo and Pt.

A process for producing an ohmic electrode for n-type cBN is disclosed. The process is comprised of the following steps: providing a thin film of at least one alloy selected from Au-Si alloy, Au-Ge alloy and Au-Si-Ge alloy, the weight ratio of Si and Ge being from 0.1 to 35% by weight, on n-type cBN; providing a thin film of at least one metal selected from Ni, Cr, Mo and Pt on the thin alloy film; and subjecting the type cBN having the films thus provided to a heat-treatment process in an inert gas or in a vacuum at a temperature ranging from 350° C. to 600° C.

7 Claims, 1 Drawing Sheet

PROCESS FOR MANUFACTURING AN OHMIC ELECTRODE FOR N-TYPE CUBIC BORON NITRIDE This is a divisional of U.S. patent application Ser. 07/689,887 filed May 28, 1991, now U.S. Pat. No. 5,187,560, dated Feb. 16, 1993.

BACKGROUND

1. Field of the Invention

The present invention relates to a process for producing an ohmic electrode for n-type cubic boron nitride.

2. Prior Art

Hitherto, for producing an electrode for a semiconductor cubic boron nitride (hereafter referred to as "cBN"), a silver paste is used as described in Appl. Phys. Lett., vol 53 (11), Sept. 12, 1988, pp. 962~964, but the actual technique for producing an ohmic electrode for a semiconductor cBN has not yet been developed at present.

In a conventional process for producing an electrode using a silver paste, the contact resistance is large and also the resistance characteristics of the passing electric current are unstable. Furthermore, a silver paste displays a poor wetting property to cBN, in addition to the problem the adhesive strength is weak, whereby the electrode is liable to be separated from the crystal. Accordingly, it is difficult to produce a semiconductor using a cBN crystal.

On the other hand, an ohmic electrode for p-type cBN is described in Japanese patent application No. 1-276346.

SUMMARY OF THE INVENTION

In such circumstances, as the result of investigations for establishing a technique of forming an electrode having a sufficient adhesive strength to a semiconductor cBN with a good low resistance, the present inventors have succeeded in accomplishing the present invention.

One object of the present invention is to provide an even n-type cBN electrode having good ohmic characteristics which are effectively utilized, e. g., for the preparation of a semiconductor device using a cBN crystal.

Other objectives and effects of the present invention will be apparent from the following description.

The present invention relates to an ohmic electrode for n-type cBN, and also relates to a process for producing an ohmic electrode for n-type cBN, which comprises the following steps; providing at least one thin alloy film selected from Au-Si alloy, Au-Ge alloy and Au-Si-Ge alloy, the weight ratio of Si, Ge and Si plus Ge being 0.1 to 35% by weight, on n-type cBN; providing a thin film of at least one metal selected from Ni, Cr, MO and Pt on the thin alloy film; and subjecting the n-type cBN having the thin films thus provided to a heat treatment in an inert gas or in a vacuum at a temperature ranging from 350° C. to 600° C. . Concerning the inert gas, $N_2$, Ar and a mixture of Ar and $N_2$ are preferable.

DETAILED DESCRIPTION OF THE INVENTION

Figure 1:
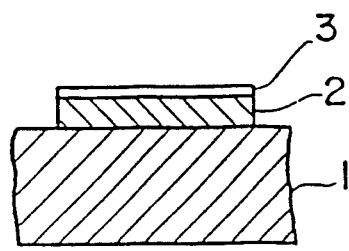
FIG. 1 is a schematic sectional view showing an ohmic electrode produced by the process of the present invention.

Referring to FIG. 1 showing a schematic sectional view of the electrode produced by the process of the present invention, one embodiment of the article and the process for producing an ohmic electrode according to the present invention is explained.

This invention provides the ohmic electrode for n-type cBN 1, on which the first thin film 2 of at least one alloy selected from Au-Si alloy, Au-Ge alloy and Au-Si-Ge alloy is coated, and the second thin film of at least one metal or alloy selected from Ni, Cr, Mo and Pt is coated.

Further, the process of the present invention may comprise the following steps: one, providing at least one thin film 2 of an alloy selected from Au-Si alloy, Au-Ge alloy and Au-Si-Ge alloy onto the surface of an n-type cBN crystal 1; two, providing at least one thin film 3 of a metal selected from Ni, Cr, Mo and Pt onto the thin film 2, and three, heat-treating the n-type cBN having the aforesaid thin film 2 and the thin film 3 at a temperature ranging from 350° C. to 600° C. in an inert gas atmosphere or in a vacuum.

It is preferable to conduct the heat-treating at a temperature ranging from 400° C. to 550° C. in an inert gas atmosphere or in a vacuum.

Conventionally, materials displaying ohmic properties at the junction with an n-type cBN crystal were previously unknown. The present inventors have investigated material having ohmic characteristics and based on the results thereof, it has been found that Au-Si alloy, Au-Ge alloy and Au-Si-Ge alloy display ohmic properties at the junction with an n-type cBN crystal. However, since the wetting property of the cBN crystal with the Au-Si alloy, Au-Ge alloy and Au-Si-Ge alloy is poor, and if the thin film from the above mentioned alloy is vapor deposited on the cBN crystal followed by heating to form an alloy, an electrode aggregate such as island forms, whereby an electrode having the desired shape can not be formed. Thus, after vapor depositing a thin film of a metal selected from Ni, Cr, Mo and Pt onto the thin Au-Si alloy, Au-Ge alloy and Au-Si-Ge alloy film, alloying is conducted, whereby the wetting property of the Au-Si alloy, Au-Ge alloy and Au-Si-Ge alloy is improved to solve the aforesaid problem caused by poor wetting properties, and an ohmic electrode having the desired form can be obtained. The wetting property of the Au-Si alloy, Au-Ge alloy and Au-Si-Ge alloy is improved to solve the aforesaid problem caused by poor wetting properties, and an ohmic electrode having the desired form can be obtained by means of a heat-treatment after vapor depositing a thin film of a metal selected from Ni, Cr, Mo and Pt or a thin alloy film thereby onto the thin Au-Si alloy, Au-Ge alloy and Au-Si-Ge alloy film. The heat treatment is generally conducted for from 5 to 60 minutes.

The method for providing the thin alloy film and the thin film of Ni, Cr, Mo or Pt is not limited, and may be vapor deposition or sputtering.

Among Ni, Cr, Mo and Pt, Ni and Cr are preferably used especially Ni and Cr are preferable from an economical point of view, and Ni is more preferably used in the present invention in view of a stability of the thin film.

In the present invention, the content of Si, Ge, Si plus Ge in the Au-Si alloy, Au-Ge alloy and Au-Si-Ge alloy is from 0.1% to 35% by weight. If the content of Si, Ge, Si plus Ge is less than 0.1% by weight, the electrode obtained does not show good ohmic characteristics, while if the content is over 35% by weight, a thin alloy film having a sufficient junction strength with the cBN crystal is not obtained.

The thickness of the aforementioned thin film of Ni, Cr, Mo and Pt with the ability to inhibit the aggregation of Au-Si alloy, Au-Ge alloy and Au-Si-Ge alloy film may generally be at least about 200 Å, preferably from 200 to 2000Å. The aforementioned thin film of Ni, Cr, Mo and Pt are formed by itself or as an alloy film.

The thickness of the thin alloy film of Au-Si alloy, Au-Ge alloy and Au-Si-Ge alloy is generally from 1000 Å to 1 μm, preferably from 1000 to 3000Å.

Vacuum deposition, sputtering and an ion plating method can be used for making a thin film of Au-Si alloy, Au-Ge alloy, Au-Si-Ge alloy, Ni, Cr, Mo and Pt. In view of a friction strength with the cBN, the ion plating method is preferably employed. The vapor deposition method is preferably employed in view of the production cost.

Without a heat treatment, an n-type cBN crystal consists of two layers can be used for n-type cBN crystals, but after the heat treatment the n-type cBN crystal has markedly better ohmic properties.

EXAMPLE

Figure 2:
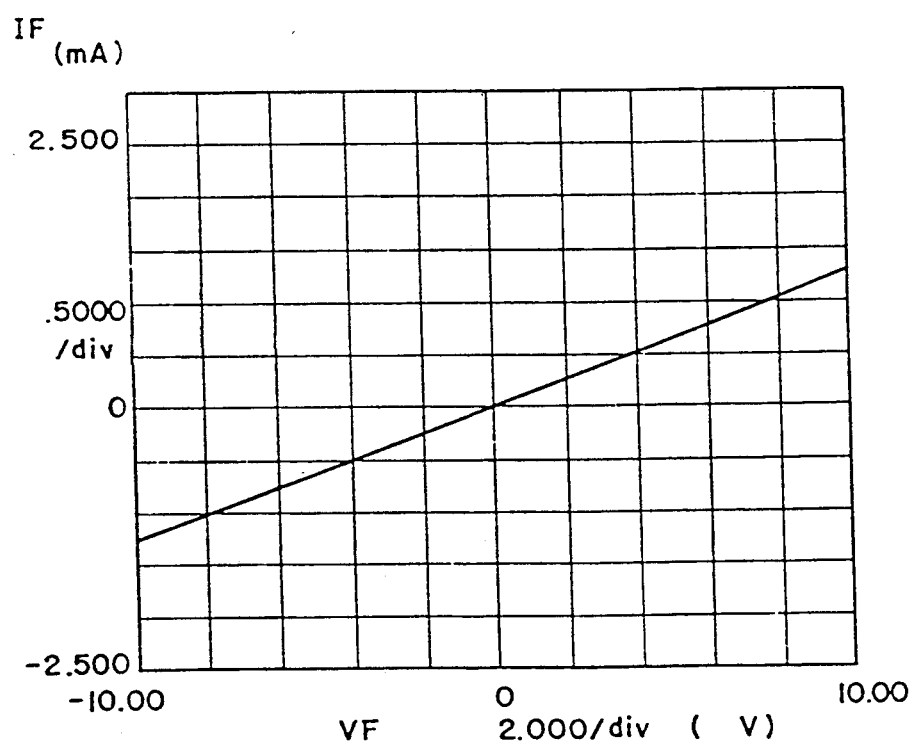
FIG. 2 is a graph showing the measurement results of the current voltage characteristics of n-type cBN using the ohmic electrode produced in the example of the present invention.

A thin Au-Si alloy film containing 2.5% of Si by weight, and having thickness of about 2000 Å was vacuum vapor deposited on an n-type cBN crystal and then a thin Cr film having a thickness of about 500 Å is further deposited thereon. The crystal having the coated film was heat treated for 10 minutes in an inert gas atmosphere at 480° C. The electrode thus formed did not cause the phenomenon of aggregation such as an island and when current voltage characteristics were measured, good ohmic characteristics as shown in FIG. 2 were obtained.

As described above, according to the present invention, a flat n-type cBN electrode having good ohmic characteristics could be obtained and hence the present invention can be effectively utilized for the preparation of a semiconductor device using a cBN crystal.

While the invention has been described in detail and with reference to specific examples thereof, it will be apparent to one skilled in the art that various changes and modification's can be made therein without departing from the spirit and scope thereof.

What is claimed is:

1. A process for producing an ohmic electrode for n-type cBN, which comprises the steps of; providing a thin alloy film of at least one alloy selected from the group consisting of Au-Si alloy, Au-Ge alloy and Au-Si-Ge alloy; providing a thin film of at least one metal selected from Ni, Cr, Mo and Pt on said thin film; and subjecting said n-type cBN having said films thus provided to a heat-treatment in an inert gas or in vacuum at a temperature ranging from 350° C. to 600° C.

2. A process as claimed in claim 1, wherein the weight ratio of Si, Ge and Si plus Ge is from 0.1 to 35%.

3. A process as claimed in claim 1, wherein the provision of said thin alloy film and thin metal film is carried out by a vacuum vapor deposition.

4. A process as claimed in claim 1, wherein said heat treatment is conducted at a temperature ranging from 400° C. to 550° C.

5. A process as claimed in claim 1, wherein the thickness of said thin film of a metal selected from Ni, Cr, Mo and Pt is ranging from 200 to 2000Å.

6. A process as claimed in claim 1, wherein the thickness of said thin alloy film is ranging from 1000 to 3000 Å.

7. A process as claimed in claim 1, wherein said thin film of a metal is selected from Ni and Cr.

* * * * *